United States Patent
Yoon et al.

(10) Patent No.: US 11,005,149 B2
(45) Date of Patent: May 11, 2021

(54) METACONDUCTOR SKINS FOR LOW LOSS RF CONDUCTORS

(71) Applicant: University of Florida Research Foundation, Inc., Gainesville, FL (US)

(72) Inventors: Yong-Kyu Yoon, Gainesville, FL (US); Todd R. Schumann, Gainesville, FL (US); Hyup-Jong Kim, Gainesville, FL (US); Seahee Hwangbo, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 50 days.

(21) Appl. No.: 16/206,620

(22) Filed: Nov. 30, 2018

(65) Prior Publication Data
US 2019/0173147 A1    Jun. 6, 2019

Related U.S. Application Data

(60) Provisional application No. 62/593,586, filed on Dec. 1, 2017.

(51) Int. Cl.
| | | |
|---|---|---|
| *H01P 3/00* | (2006.01) | |
| *H01L 23/66* | (2006.01) | |
| *H01P 5/08* | (2006.01) | |
| *H01L 21/00* | (2006.01) | |
| *C30B 29/68* | (2006.01) | |
| *C30B 23/02* | (2006.01) | |

(Continued)

(52) U.S. Cl.
CPC ............ *H01P 3/006* (2013.01); *C30B 23/025* (2013.01); *C30B 23/04* (2013.01); *C30B 29/02* (2013.01); *C30B 29/68* (2013.01); *H01L 21/00* (2013.01); *H01L 23/66* (2013.01); *H01P 5/08* (2013.01); *H01L 2223/6627* (2013.01)

(58) Field of Classification Search
CPC .......... H01P 3/006; H01P 5/08; C30B 23/025; C30B 23/04; C30B 29/02; C30B 29/68; H01L 21/00; H01L 23/66; H01L 2223/6627
USPC ......................................................... 333/238
See application file for complete search history.

(56) References Cited

U.S. PATENT DOCUMENTS

| | | | | |
|---|---|---|---|---|
| 3,417,350 A | * | 12/1968 | Cruz | ........................ H03J 1/08 333/35 |
| 2016/0002103 A1 | * | 1/2016 | Wang | ..................... C03C 15/00 428/141 |
| 2016/0148714 A1 | * | 5/2016 | Yoon | ................. H01L 23/49894 174/28 |

OTHER PUBLICATIONS

Iramnaaz et al., "Self-biased low loss conductor featured with skin effect suppression for high quality RF passives", IEEE Transactions on Magnetics, vol. 48, No. 11, Nov. 2012 (Year: 2012).*

(Continued)

*Primary Examiner* — Benny T Lee
*Assistant Examiner* — Hafizur Rahman
(74) *Attorney, Agent, or Firm* — Thomas | Horstemeyer, LLP

(57) ABSTRACT

Various examples related to metaconductor based skins and transmission lines are provided. In one example, a flexible metaconductor skin includes a flexible substrate; at least one layer of non-ferromagnetic metal disposed on the flexible substrate; and a layer of ferromagnetic metal disposed on the at least one layer of non-ferromagnetic metal. The flexible metaconductor skin can be used as a multi-layer coplanar waveguide (CPW) transmission line.

20 Claims, 9 Drawing Sheets

(51) Int. Cl.
*C30B 29/02* (2006.01)
*C30B 23/04* (2006.01)

(56) References Cited

OTHER PUBLICATIONS

Iramnaaz et al., High Quality Factor RF Inductors Using Low Loss Conductor Featured with Skin Effect Suppression for Standard CMOS/BiCMOS, 2011 IEEE Electronic Components and Technology Conference. (Year: 2011).*

Yamaguchi et al., "Skin Effect Suppression in Multilayer Thin-Film Spiral Inductor Taking Advantage of Negative Permeability of Magnetic Film beyond FMR frequency", Proceedings of the 40th European Microwave Conference, Sep. 28-30, 2010, Paris, France (Year: 2010).*

Sheena Hussaini, "Integrated Magnetic Components for RF Applications", Ph.D. Thesis, Wright State University, 2015 (Year: 2015).*

Dai et al., "Electrodeposited CoCu/Cu meta-conductor with suppressed skin effect for next generation radio frequency electronics", Nov. 12, 2018, Journal of Alloys and Compounds 778, pp. 156-162. (Year: 2018).*

Endo et. al. "Effect of Zr and Nb additions on the high frequency magnetic properties of $Co_{85-(x+y)}Zr_{3+x}Nb_{12+y}$ films", Published Online: Apr. 16, 2015 on J. Appl. Phys. 117, 17A330 (2015) (Year: 2015).*

* cited by examiner

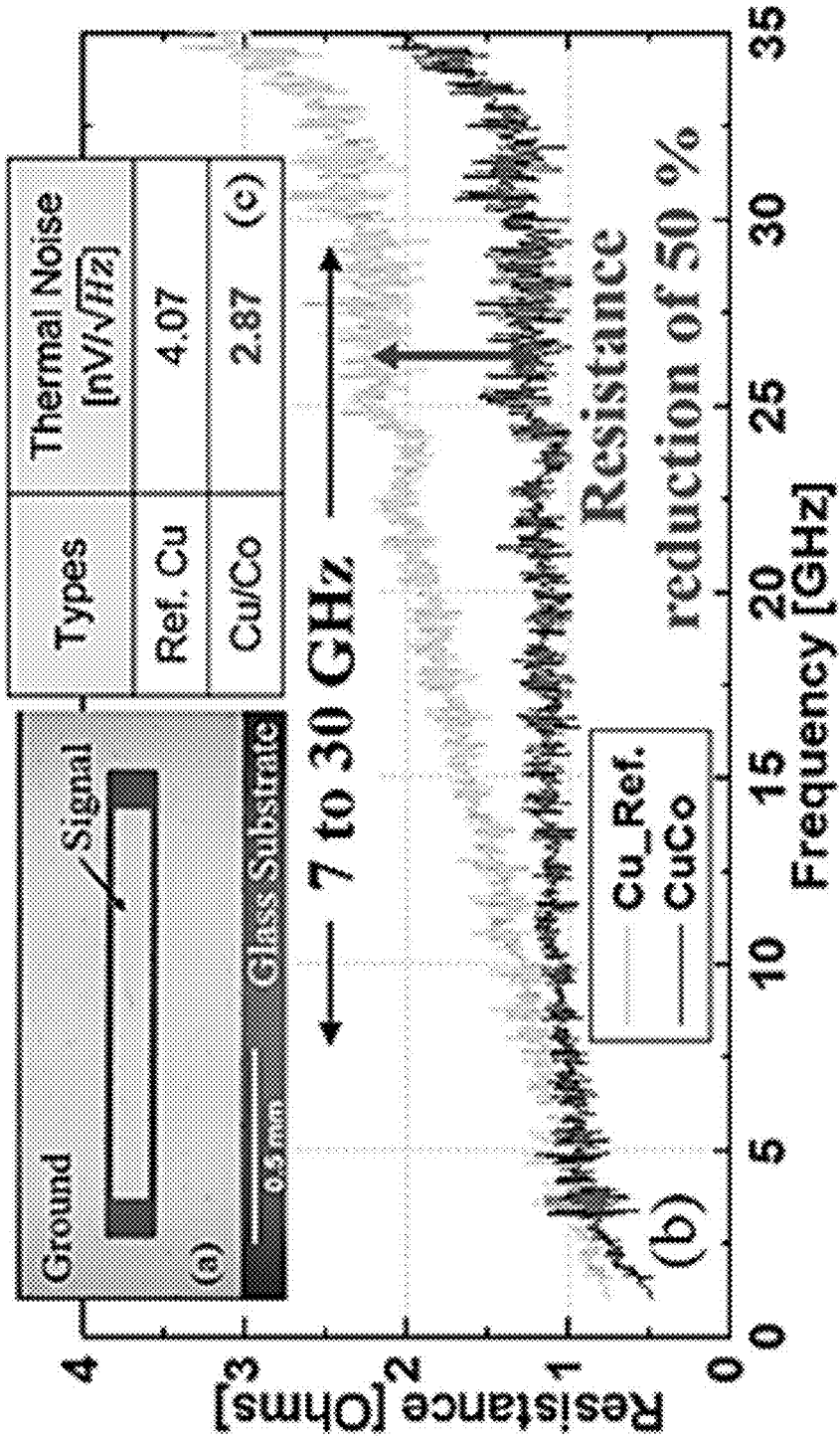

| Ref. | Multilayer Structure Material | Max loss reduction [%] | Freq. range with loss reduction [GHz] |
|---|---|---|---|
| [1] | Cu/CoZrNb (750 nm/25 nm) | 20 | 4 – 8 |
| [2] | Cu/NiFe (300 nm/100 nm) | 40 | 10 – 15 |
| [3] | Cu/Ni (150 nm/25 nm) | 50 | 10 – 20 |
| This work | Cu/Co (150 nm/25 nm) | 50 | 7 – 32 |

[1] N. Sato et al., "Skin effect suppression for Cu/CoZrNb multilayered inductor," *J. Appl. Phys.*, vol. 111, Feb. 2012, Art. no. 07A501.

[2] Y. Zhuang et al., "Magnetic-multilayered interconnects for skin effect suppression," *IEEE Elec. Dev. Lett.*, vol. 29, no. 4, pp.319–321, 2008.

[3] Arian Rahimi and Yong-Kyu Yoon, "Study on Cu/Ni Nano Superlattice Conductors for Reduced RF Loss," *IEEE Microwave and Wireless Components Letters*, 26.4 (2016): 258-260.

FIG. 10

METACONDUCTOR SKINS FOR LOW LOSS RF CONDUCTORS

CROSS REFERENCE TO RELATED APPLICATIONS

This application claims priority to, and the benefit of, U.S. provisional application entitled "Metaconductor Skins for Low Loss RF Conductors" having Ser. No. 62/593,586, filed Dec. 1, 2017, the entirety of which is hereby incorporated by reference.

BACKGROUND

The operating frequency of the electronic devices increases in order to mitigate the crowded traffic in the lower frequency bands. One of the challenges for the devices operating at high frequencies is inferior signal integrity such as high loss, high noise, and long RC delay since the conductor loss grows significantly as a function of frequency due to the skin effect. As the frequency increases, the skin depth of the conductors is decreased, reducing the effective cross sectional area of the conductors and increasing the resistance, resulting in increased conductor loss.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 7A is an image of a fabricated CPW transmission line of FIG. 5A, in accordance with various embodiments of the present disclosure.

FIGS. 7B and 7C illustrate the measured ohmic resistance and thermal noise of the CPW transmission line of FIG. 7A and a reference copper conductor, in accordance with various embodiments of the present disclosure.

FIG. 10 is a table summarizing a comparison of state-of-the-art RF conductors that employ various ferromagnetic materials to reduce the RF conductor loss, in accordance with various embodiments of the present disclosure.

DETAILED DESCRIPTION

Figure 1:
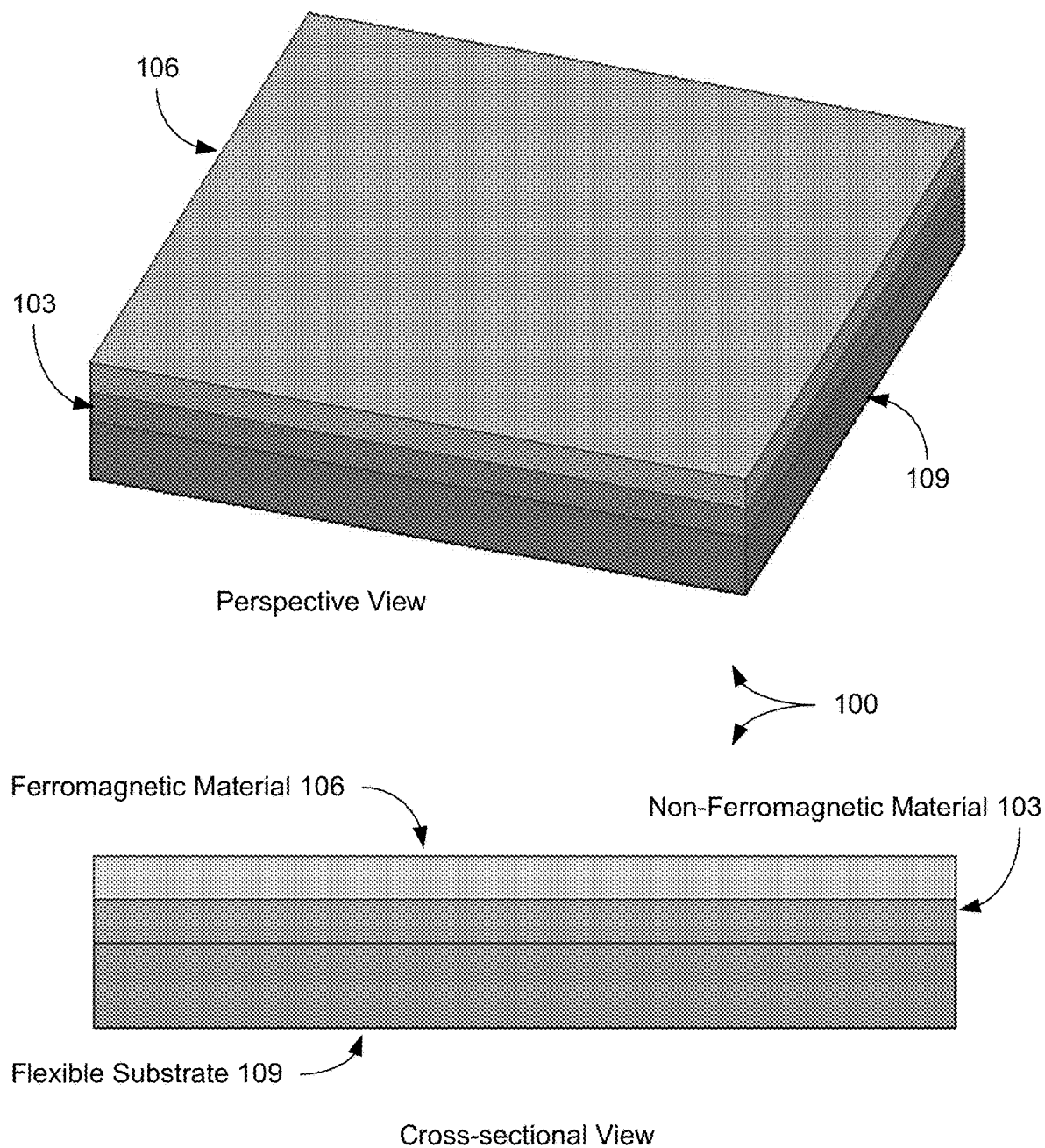
FIG. 1 is a graphical representation illustrating perspective and cross-sectional views of an example of a metaconductor skin, in accordance with various embodiments of the present disclosure.

Disclosed herein are various embodiments related to metaconductor based skins and transmission lines. For example, a copper/cobalt (Cu/Co) metaconductor based coplanar waveguide (CPW) transmission lines, which exhibit excellent signal integrity at K-bands and millimeter wave frequencies such as low conductor loss, reduced signal dispersion, and low noise figure, are disclosed. Reference will now be made in detail to the description of the embodiments as illustrated in the drawings, wherein like reference numbers indicate like parts throughout the several views.

Multi-layer superlattice conductors have been studied to replace the solid copper conductors and improve RF conductor loss performance. In many cases, special alloy ferromagnetic materials are used, which often incurs high process complexity and cost to keep the exact stoichiometric ratio among alloy elements. Also, most resistance reduction so far reported is below 20 GHz, which is not fully responsive to future broad band frequency spectra such as $K_u$ (12 to 18 GHz), K (18 to 27 GHz), and $K_a$ (26.5 to 40 GHz) bands and mm-wave frequencies.

Here, copper and cobalt (Cu/Co) based metaconductors are explored as broadband conductors with superior signal integrity performance in all the K-bands and low millimeter wave range for the first time. As Co has a higher ferromagnetic resonant frequency compared to other soft ferromagnetic materials such as Ni (or NiFe), the resistance reduction resulting from the Eddy current cancellation (ECC) can be achieved in a much higher frequency range (e.g., 7 GHz-32 GHz). The phase velocity of the Cu/Co metaconductor can show the improved dispersion characteristic of the transmission lines when compared to that of a reference Cu conductor. Also, the reduction of the thermal noise voltage can be calculated. Its superior signal integrity performance is compared with that of other state-of-the-art multi-layer devices reported.

A metaconductor skin 100 can comprise at least a single layer of non-ferromagnetic metal 103 and a single layer of ferromagnetic metal 106 on an optional flexible substrate 109. FIG. 1 shows perspective and cross-sectional views of an example of a metaconductor skin 100 with a single layer of non-ferromagnetic metal 103 and a single layer of ferromagnetic metal 106 on a flexible substrate 109. Non-ferromagnetic metals 103 can comprise, e.g., gold (Au), silver (Ag), aluminum (Al), and/or carbon materials (e.g., graphene, etc.); and ferromagnetic metals 106 can comprise, e.g., Ni, NiFe, Co, FeCo, NiFeCo, FePt, CoPt, FeCoPt, etc. The metaconductor skin 100 can be designed to have a low conductor loss in a radio frequency (RF) range, where the magnetic permeability of the ferromagnetic metal 106 is negative and that of the non-ferromagnetic metal 103 is positive. The magnetic flux induced in each layer by the applied alternating current (AC) cancels each other out, and so is the eddy current. The resultant current in the metal layers 103/106 will not suffer from the skin effect. As the thickness of each layer 103/106 is very thin (e.g., in the range from a few nm to a few hundred nm), the electrical resistance is high. The flexible substrate 109 can be eliminated (null or air), or can be a ferromagnetic metal layer (e.g., Ni, NiFe, Co etc.) where the summation of the thicknesses of this ferromagnetic metal (conductor) layer and the top most ferromagnetic metal (conductor) layer will be the same thickness as other ferromagnetic metal layers. The flexible substrate 109 can be low loss dielectric substrates including commercially available polymeric materials such as, e.g., polyimide (Kapton tape, Uline Co.), epoxy (SU-8), polydimethylsiloxane (PDMS), polymethylmethacrylate (PMMI), parylene, FR4, liquid crystal polymer (LCP), dielectric used for Ultralam (3000 series, Rogers Co.), whose thickness is a few 10's micrometers to a few hundred micrometers, glass substrate (SGW glass, Corning Inc.), (10's micrometer to 100's micrometer thick), quartz, or a combination thereof. Also, flexible double copper clad printing circuit boards themselves such as, e.g., Ultralam (3000, Rogers Co.) can be used as the substrates.

Figure 2:
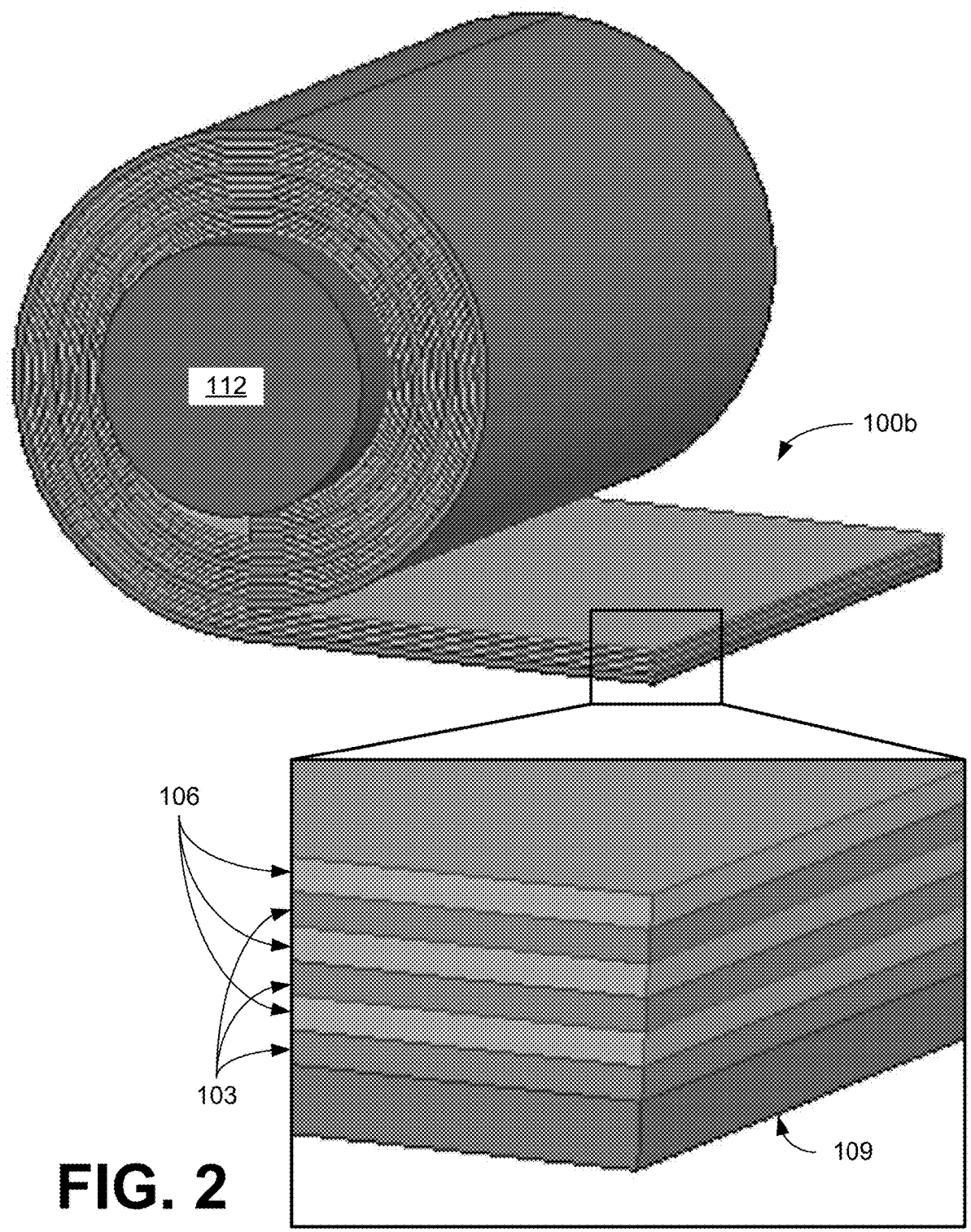
FIG. 2 is a graphical representation illustrating a metaconductor skin wrapped around a core, in accordance with various embodiments of the present disclosure.

In order to reduce the total resistance, multiple metaconductor skin layers (layers of non-ferromagnetic metal 103 and ferromagnetic metal 106) can be stacked. As the layers of metaconductor skin are stacked together, the resultant multiple layer metaconductor skin (or multi-layer metaconductor skin) 100 may not see the skin effect with the eddy current cancelled. FIG. 2 illustrates an example of a multi-layer metaconductor skin 100b comprising multiple layers of non-ferromagnetic metal 103 and ferromagnetic metal 106 stacked on a flexible substrate 109 (which may be optional), as shown in the insert. The more layers of metaconductor skin are stacked, the less RF electrical resistance can be obtained.

The metaconductor skin 100 can be fabricated using thin layer metal deposition techniques such as sputtering, evaporation, atomic layer deposition, and electrodeposition on a flexible organic or inorganic substrate. As the metaconductor skin 100 is flexible, it can wrap around a core structure 112 such as a cylinder, a cubicle, or an arbitrary object including a planar surface. FIG. 2 shows an example of a metaconductor skin wrapping around a cylinder (e.g., a cylindrical core). The core can be either conductive (e.g., an electrical conductor) or nonconductive (including air). The core material can include metals such as Au, Ag, Cu, Al, Ni, NiFe, Co, and Pt; and/or conductive/non-conductive polymer/ceramic/semiconductor materials such as, e.g., epoxy, polyurethane, polyimide, $Al_2O_3$, $SiO_2$, glass, Si, GaAs, GaN, InP, and carbon structures; and air.

Highly power efficient 3-D antennas, waveguides, and other RF components can be easily constructed using the metaconductor skins 100. For example, the antenna and waveguide backbones can be fabricated using 3-D printing and the surface can be further covered with the metaconductor skin 100. Or RF components made of solid copper, bronze, and aluminum can be further covered with the metaconductor skin 100 to reduce the RF conductor loss at an operating frequency. The metaconductor skin 100 can be designed to have low resistance at a particular frequency by choosing a different ferromagnetic metal material (e.g., Ni, NiFe, Co, FeCo, NiFeCo, FePt, CoPt, FeCoPt, etc.) and a different thickness ratio between the non-ferromagnetic metal(s) 103 and ferromagnetic metal 106. Also, metaconductor skins can be glued together to form a high efficiency printing circuit board (PCB) on top of a low loss dielectric substrate. For example, a copper layer can be replaced by the metaconductor layer, or on top of an existing PCB board to form a hybrid metaconductor PCB.

The metaconductor skins 100 can also be used as coplanar waveguide (CPW) transmission lines. For example, CPW transmission lines comprising 10 pairs of Cu and Co thin film metaconductor layers with a layer thicknesses of 150 nm and 25 nm, respectively, have been designed, fabricated and characterized. Additional pairs of non-ferromagnetic metal and ferromagnetic metal layers can be included (e.g., up to 100 pairs or more). Experimental results show an RF resistance reduction of up to 50% (Max.) in a range from 7 GHz to 32 GHz, 25.5% delay performance improvement, and 30% thermal noise voltage reduction when compared with reference copper based CPWs. Compared with devices from other literatures, the presented CPW device shows the best signal integrity performance in Ku, K, and Ka bands.

At high frequencies, the ohmic loss, the resultant RC delay of conductors, and the associated thermal noise can become significant as the skin effect causes the RF conductor resistance to greatly increase. This can degrade the signal integrity performance of the RF interconnects and components. A multilayer Cu/Co nano-superlattice metaconductor skin 100 enables the skin depth ($\delta$) to enlarge due to the cancellation of the eddy current from the ferromagnetic material 106 (Co) and that of the non-ferromagnetic material 103 (Cu), where the ferromagnetic material 106 shows a negative permeability at the frequencies of interest. It is possible to make the skin depth reach to the infinity by setting the effective relative permeability $\mu_{r\_eff}$ contributed by Cu and Co close to zero as:

$$\delta = \sqrt{\frac{2}{\omega \mu_0 \mu_{r\_eff} \sigma}} \approx \infty \text{ for } \mu_{r\_eff} = 0, \quad (1)$$

where $\omega$ is the angular frequency, $\mu_{r\_eff}$ the effective relative magnetic permeability of the conductor, and $\sigma$ its average electrical conductivity. The infinite skin depth implies that the current can flow though the volume of the conductor, resulting in the reduction of the RF ohmic resistance and the associated RC delay in the frequency range with $\mu_{r\_eff}$ of zero. The effective magnetic permeability ($\mu_{r\_eff}$) of the multiple non-ferromagentic/ferromagnetic layers 103/106 can be given as:

$$\mu_{r\_eff} = \frac{\mu_N t_N + \mu_F t_F}{t_N + t_F}, \quad (2)$$

where $\mu_N$ and $\mu_F$ are the permeability of the non-ferromagnetic metal 103 and ferromagnetic metal 106, and $t_N$ and $t_F$ are their thicknesses, respectively. Therefore, in a condition of $\mu_F<0$ (the negative permeability for a ferromagnetic material 106) and $\mu_N=1$ (for non-ferromagnetic material 103 of Cu), it is possible to manipulate $\mu_{r\_eff}$ to zero by properly designing the multilayer thickness ratio as:

$$\mu_{r\_eff} \approx 0 \text{ if } |\mu_F| = \text{thickness ratio} = \frac{t_N}{t_F}. \quad (3)$$

The theoretical and experimental dynamic frequency response of ferromagnetic thin films has been investigated.

The Landau-Lifshitz-Gilbert (LLG) equation used to estimate the complex permeability of the ferromagnetic thin film is given by:

$$\mu_r = \frac{(\gamma H_a + j\omega\alpha + \omega_M)^2 - \omega^2}{(\gamma H_a + j\omega\alpha)(\gamma H_a + j\omega\alpha + \omega_M) - \omega^2}, \omega_M = \gamma M_s, \quad (4)$$

where $\mu_r$ is the complex relative permeability, $\omega$ the angular frequency, $\gamma$ the gyromagnetic ratio, $\alpha$ the Gilbert damping constant, $M_s$ the magnetization saturation, and $H_a$ the anisotropy field. The real part of the relative permeability of a ferromagnetic material 106 becomes negative above its ferromagnetic resonance frequency, $f_{FMR}$, utilized for ECC in the frequency regime.

Figure 3:
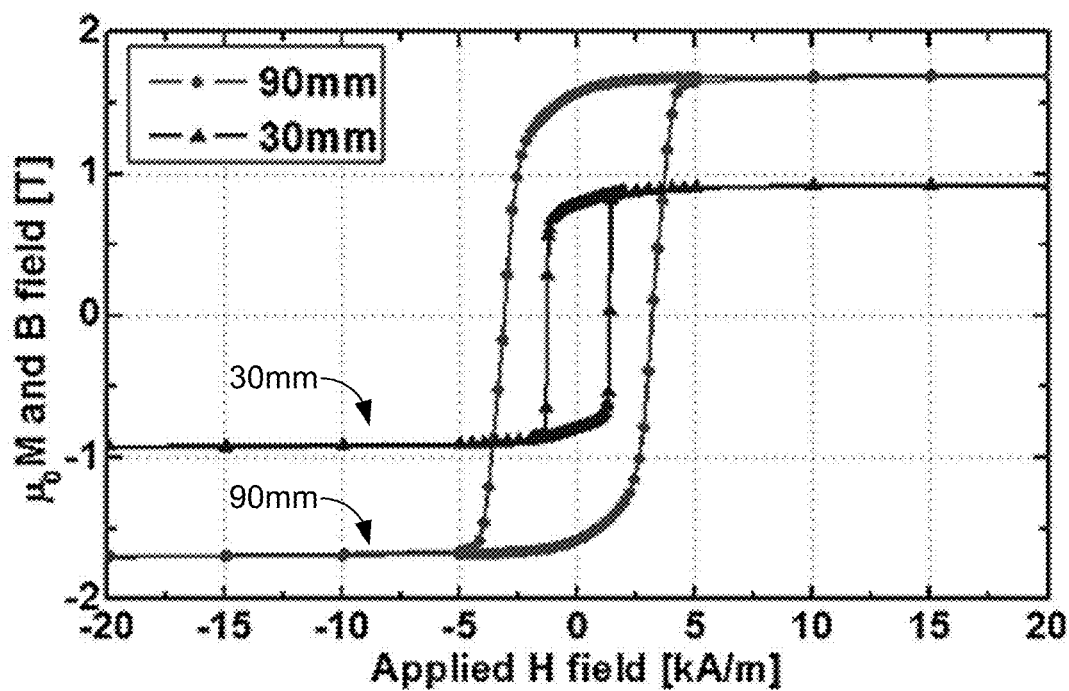
FIG. 3 is a plot illustrating examples of magnetic B-H plots of cobalt thin films for different thicknesses, in accordance with various embodiments of the present disclosure.
Figure 4:
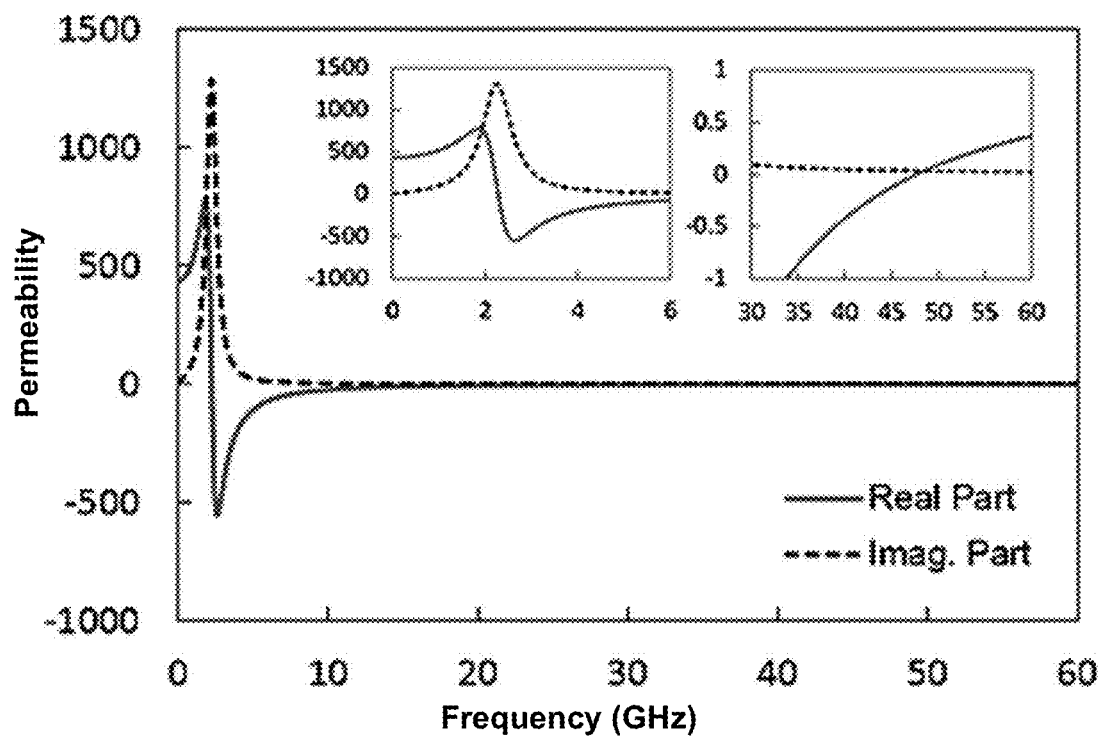
FIG. 4 is a plot of examples of the calculated permeability of cobalt thin films, in accordance with various embodiments of the present disclosure.

FIG. 3 shows examples of magnetic B-H plots of Co thin films for different thicknesses. The ferromagnetic material characteristics of Co were obtained from vibrating sample magnetometer (VSM) measurements (ADE Technologies EV9 with a maximum applied field of ±1800 kA m$^{-1}$). It was observed that the coercivity of the film increases as the thickness of the Co film increases. FIG. 4 shows examples of the calculated permeability of the Co thin films over a range from 0 to 60 GHz. The calculated permeability of the Co layer was determined using the LLG equation where the magnetic saturation $M_s$=17,000 G=1.7 T, the in-plane anisotropy field $H_a$=40 Oe, the out-of-plane anisotropy field (not seen in FIG. 3) of approximately 0 Oe, the gyromagnetic ratio $\gamma$=1.76×10$^7$ s$^{-1}$ Oe$^{-1}$, the Gilbert damping parameter $\alpha$=0.016, and the thickness of the thin film t. The in-plane and out-of-plane anisotropy fields and the magnetization saturation are read from the measured B-H characteristic loop in FIG. 3. The inserts show the real (solid) and imaginary (dashed) part of the magnetic permeability between 0 to 6 GHz (left) and 30 to 60 GHz (right).

The skin depth (6) is calculated using the electrical conductivity of Co and Cu with $\sigma_{co}$=2.38×10$^6$ S/m, and $\sigma_{cu}$=5.8×10$^7$ S/m, respectively. The ferromagnetic resonance frequency $f_{FMR}$ and the anti-resonance frequency $f_{AR}$ of Co is 2 GHz and 49.8 GHz, respectively.

Figures 5A, 5B:
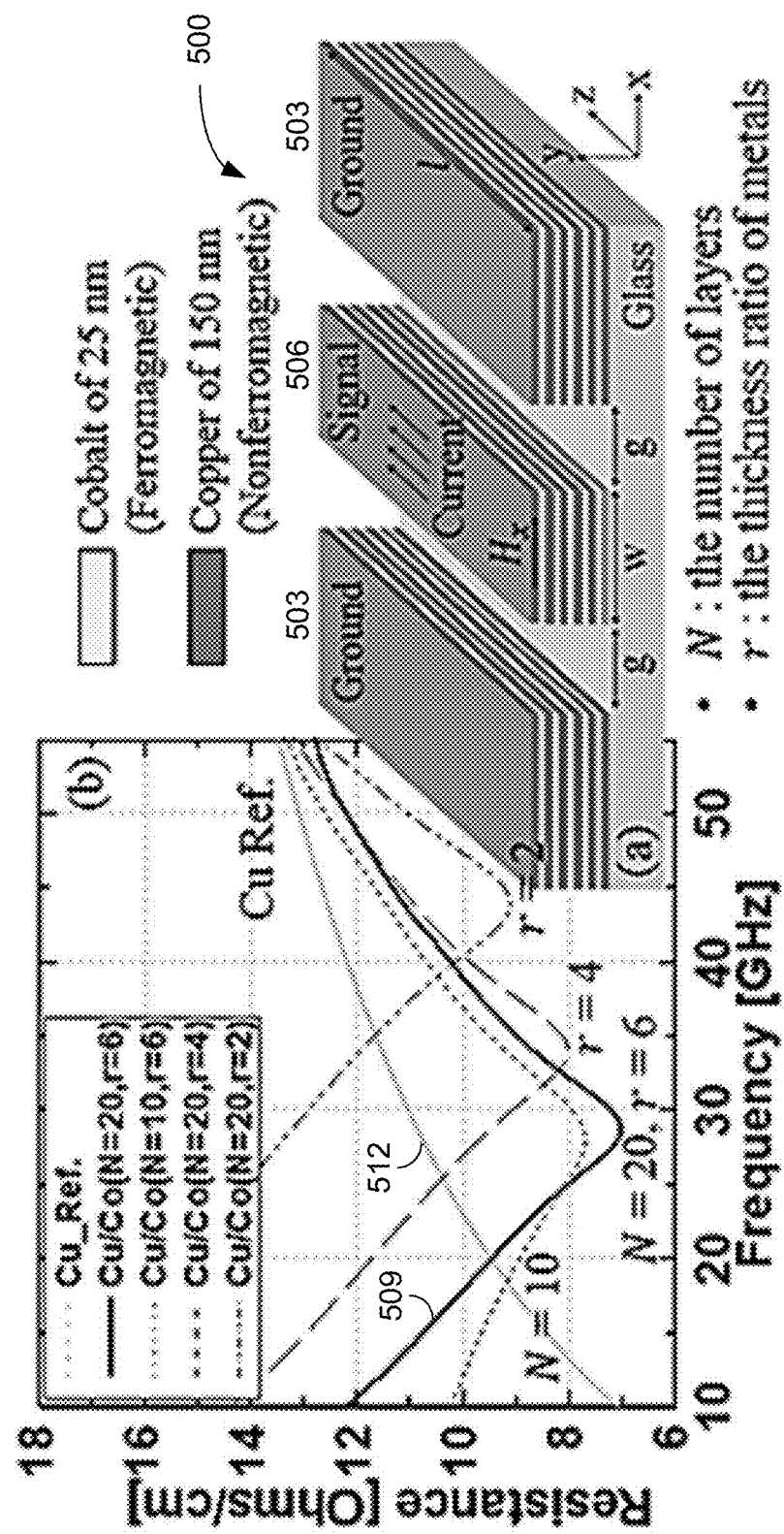
FIG. 5A illustrates an example of a metaconductor skin used as a multi-layer CPW transmission line, in accordance with various embodiments of the present disclosure.
FIG. 5B illustrates an example of the simulated resistance of the metaconductor skin of FIG. 5A, in accordance with various embodiments of the present disclosure.

FIGS. 5A and 5B illustrate an example of a metaconductor skin 100 used as a multi-layer CPW transmission line and the simulated resistance of the metaconductor skin 100, respectively. FIG. 5A shows a schematic view of the multi-layer coplanar waveguide (CPW) transmission line 500 employing a Cu/Co superlattice metaconductor comprising 10 paired Cu/Co thin films forming the multi-layer metaconductor skin in the Cartesian coordinate system. The gap (g) between the grounds 503 and the signal line 506 is 20 μm and the width (w) and length (l) of the signal line 506 is 100 μm and 1 mm, respectively. The total number of layers are 20 layers (10 pairs) and the thickness of each non-ferromagnetic Cu layer and ferromagnetic Co layer is 150 nm and 25 nm, respectively, resulting in the superlattice metaconductor with a total thickness of 1.75 μm.

A reference solid Cu conductor with the same thickness of 1.75 μm has been simulated as well for comparison. Full-wave structure simulation was performed using High Frequency Structure Simulator (HFSS, v. 15.0, ANSYS Inc.) to study the resistance reduction of the multi-layer metaconductor skin compared to the reference solid Cu conductor. The permeability shown in FIG. 4 was utilized for the HFSS simulation.

Figure 5C:
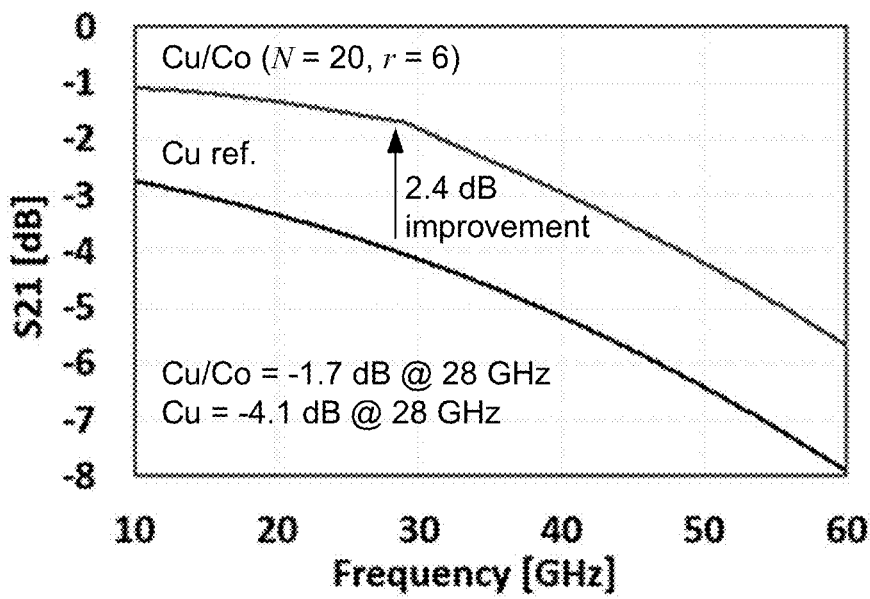
FIG. 5C illustrates an example of the simulated insertion losses of the metaconductor skin of FIG. 5A, in accordance with various embodiments of the present disclosure.

FIG. 5B shows the simulated resistances of the multi-layer Cu/Co metaconductor skin and the solid reference Cu conductor, with a constant thickness of 1.75 μm. The solid line 509 shows the resistance of the metaconductor while the dashed line 512 shows the resistance of the reference Cu conductor. The simulated resistances of the Cu/Co metaconductor and reference Cu conductor is 7 Ω/cm and 11 Ω/cm at 28.8 GHz, respectively, indicating a resistance reduction of up to 33.4%. Additionally, it has been observed that the resistance at 29 GHz decreases as the number of layers (N) is increased. Also, the tunability of the Cu/Co metaconductor has been observed where the minimum ohmic resistance point is shifted based on the thickness ratio (r) of the Cu/Co metaconductor. If the thickness ratio is changing, a new $\mu_F$ satisfying Eq. (3) can be selected, which will give a new frequency with the lowest resistance for the new $\mu_F$ from FIG. 4. FIG. 5C illustrates the simulated S21 insertion losses of the multi-layer Cu/Co metaconductor skin and the solid reference Cu conductor. The simulated insertion losses show 2.4 dB improvement at 28 GHz for the CPW transmission lines.

Figure 6A:
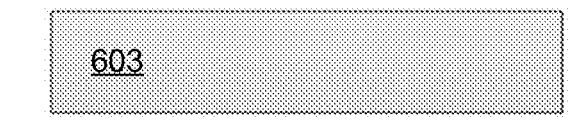
FIGS. 6A-6E illustrate an example of fabrication of a CPW transmission line of FIG. 5A, in accordance with various embodiments of the present disclosure.
Figure 6B:
Figure 6C:
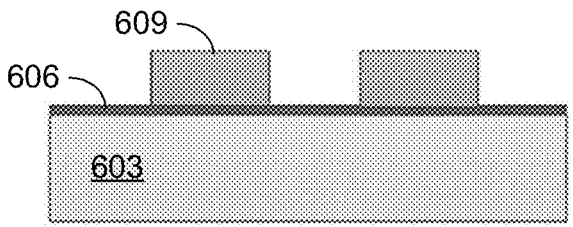
Figure 6D:
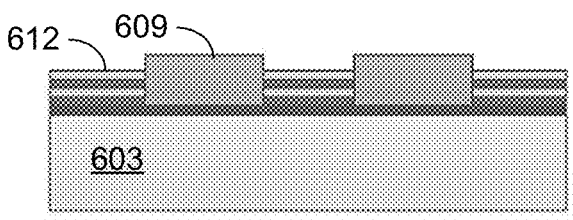
Figure 6E:
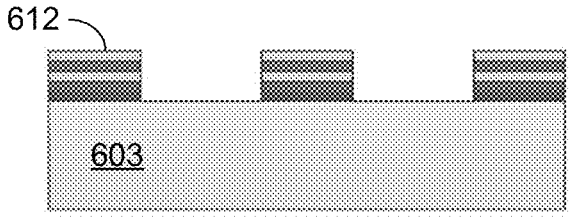

CPW transmission lines consisting of the Cu/Co metaconductor skins were fabricated to experimentally verify their RF performance. FIGS. 6A-6E illustrate an example of the fabrication process. A low loss glass substrate 603 with a thickness of 300 μm (SGW3, Corning, Inc.) was used, which showed a highly uniform surface roughness good for device implementation. Piranha cleaning was performed to remove any organic particles on the substrate 603, as shown in FIG. 6A, and a 30 nm Titanium (Ti) layer 606 was deposited as an adhesion promotion layer on the substrate 603, as shown in FIG. 6B. Photoresist 609 (NR9-8000P, Futurrex Inc.) was spincoated on top of the Ti layer 606 and soft baked at 120° C. for 4 min. Ultraviolet light exposure was performed, followed by a post-exposure bake at 75° C. for 3 min, and development (RD 6, Futurrex Inc.) to remove unexposed photoresist, as shown in FIG. 6C. 10 paired Cu/Co (150 nm/25 nm) thin layers were alternatingly deposited with a deposition rate of 2 Å/s and 0.5 Å/s, respectively, using an E-beam evaporator (UF NRF cleanroom) to build the superlattice metaconductor 612, as shown in FIG. 6D. Photoresist 609 was removed in acetone to lift-off the metal on the photoresist, as shown in FIG. 6E. The Ti layer 606 was removed using diluted hydrofluoric acid. Reference Cu conductors were fabricated similarly for comparison. A similar process can be utilized to form metaconductor skins (e.g., for CPW transmission lines) on a flexible substrate.

FIG. 7A shows a top view of the fabricated CPW transmission line 500 (FIG. 5) on the glass substrate. A 1 mm long signal line with a width of 100 μm was surrounded by the ground plane. The measured ohmic resistance of the Cu/Co metaconductor based CPW transmission line 500 and the reference Cu conductor is shown in FIG. 7B. The resistance was extracted from two-port scattering parameters using a PNA Network Analyzer (E8361A, Agilent Technologies Inc.) after two-port short-open-load-thru calibration. The resistance of the metaconductor CPW line 500 shows a similar trend to that of the reference Cu up to 7 GHz. For frequencies above 7 GHz, the resistance of the reference Cu based CPW line keeps increasing while that of the Cu/Co metaconductor CPW line 500 does not, resulting in a maximum resistance difference around 30 GHz, which is similar to the RF regime that the theory predicts. In particular, a resistance reduction of about 40% to about 50% was observed around 20 GHz-30 GHz, which is the best RF resistance performance reported in that frequency range by far. There are discrepancies between the measured and the theoretical resistances below 20 GHz and above 30 GHz. When the thickness of each Co layer (25 nm) is thin, magnetic materials express highly nonlinear effects based on the magnetic domain theory and the giant magnetoresistive (GMR) effect. This may account, in part, for the discrepancies. The calculated thermal noise of the Cu and Cu/Co conductor is shown in FIG. 7C. A thermal noise of 2.87 nV/$\sqrt{Hz}$ for the Cu/Co metaconductor was calculated in room temperature, showing a 30% reduction compared to the Cu reference.

Figure 8A:
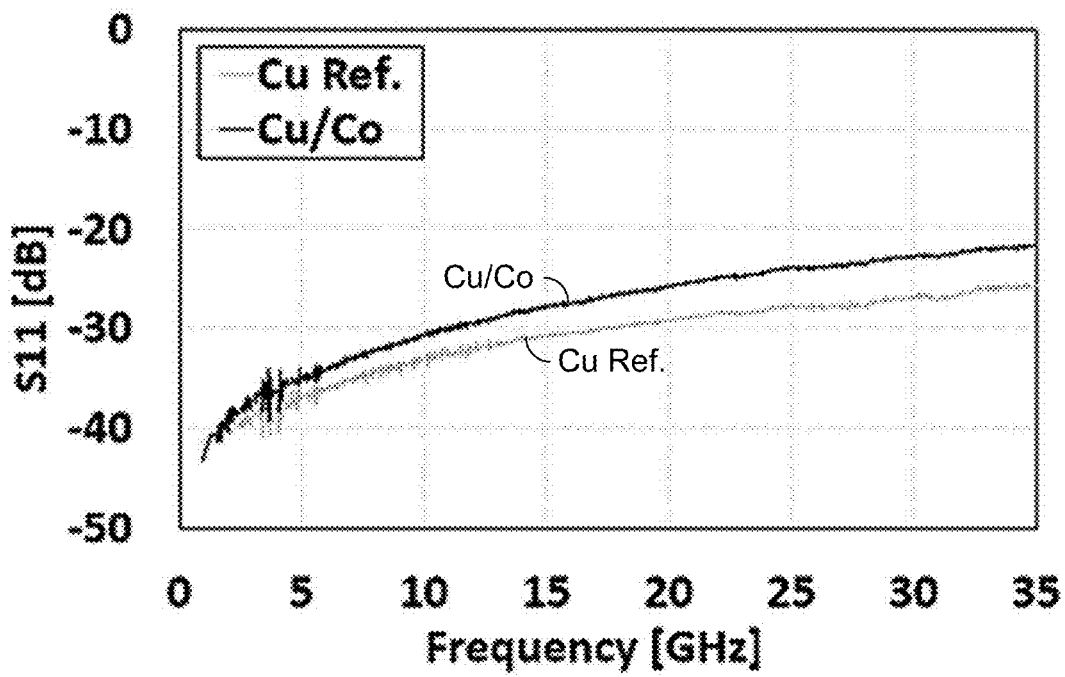
FIGS. 8A and 8B illustrate examples of the insertion loss improvement with respect to the reference copper conductor, in accordance with various embodiments of the present disclosure.
Figure 8B:
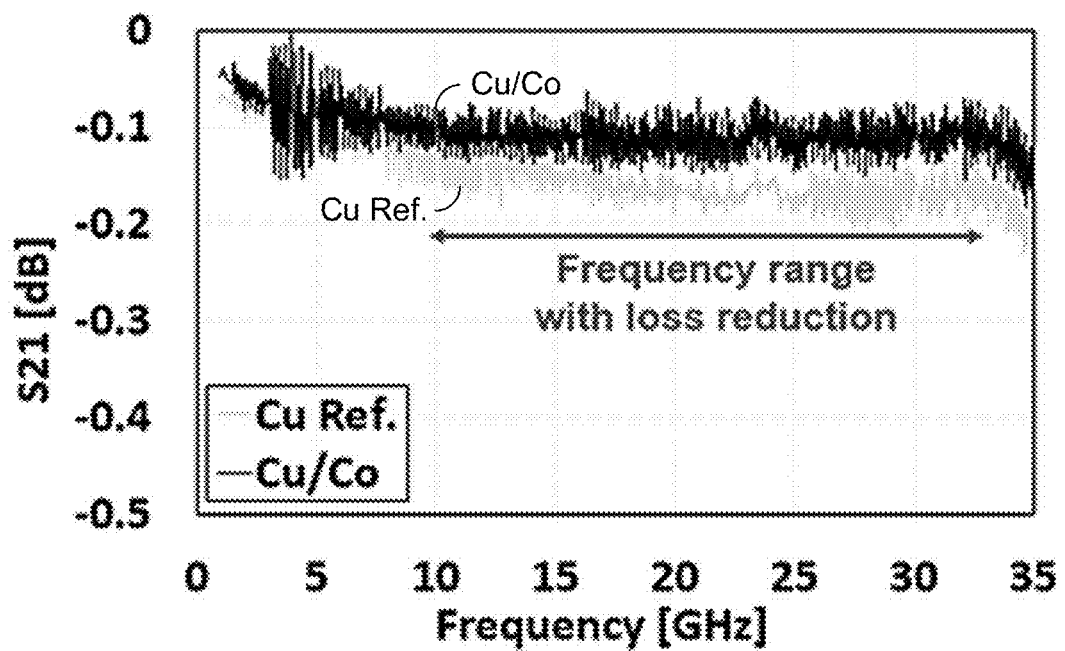

FIGS. 8A and 8B illustrates the insertion loss improvement from 7 GHz-32 GHz. FIG. 8A shows the measured return loss characteristics (S11) and FIG. 8B shows the insertion loss characteristics (S21) of the fabricated CPW transmission lines of the Cu/Co metaconductor and the reference Cu conductor.

Figure 9:
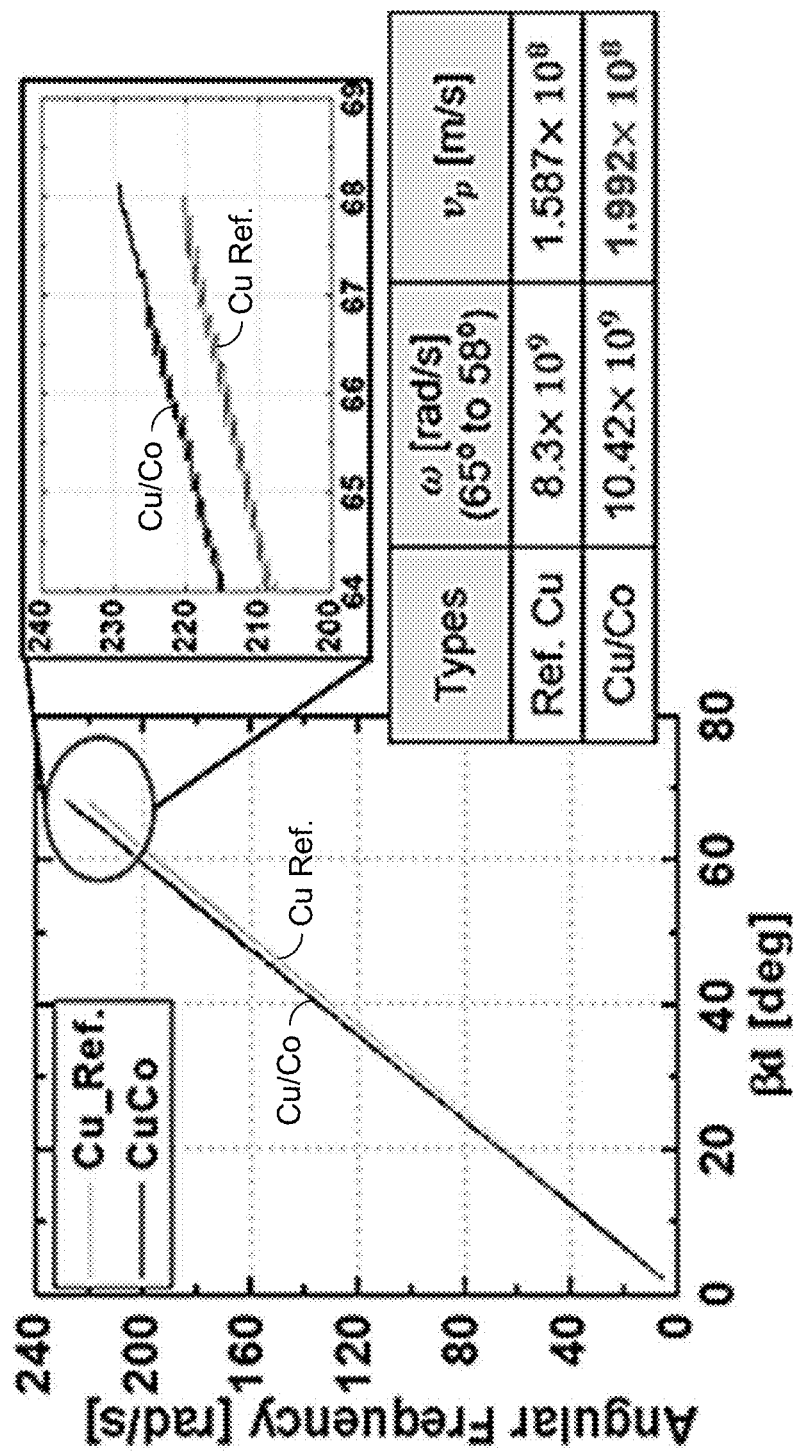
FIG. 9 illustrates an example of the measured dispersion diagram with respect to the reference copper conductor, in accordance with various embodiments of the present disclosure.

FIG. 9 shows an example of the measured dispersion diagram (extracted phase velocities) of the reference Cu conductor and the multi-layer Cu/Co metaconductor skin. A phase velocity of $1.992 \times 10^8$ m/s for the Cu/Co metaconductor was achieved at 30 GHz, showing 25.5% phase delay improvement compared to that of the Cu conductor. It can be concluded that the Cu/Co metaconductor is less dispersive than the Cu reference conductor.

In this disclosure, RF characteristics of metaconductor skins such as Cu/Co metaconductor based transmission lines have been demonstrated up to the Ka band showing superior signal integrity performance including RF resistance, dispersion relationship, and noise characteristics. In one example, 10 paired multilayer Cu/Co metaconductor based transmission lines have been microfabricated and the resistance and dispersion of the conductor have been reported. FIG. 10 is a table summarizing a comparison of the state-of-the-art RF conductors that employ various ferromagnetic materials to reduce the RF conductor loss. The thickness of each Cu layer in this disclosure was 150 nm, which is much less than one skin depth (420 nm at 25 GHz) to suppress the self-confined eddy currents. A large loss reduction of up to 50% was demonstrated with the Cu/Co metaconductor skin compared with the Cu reference. The total thickness of the 10 paired Cu/Co metaconductor layers and the reference Cu conductor was 1.75 μm. The metaconductor skin may be exploited for next generation high performance RF circuits and systems in the Ku, K, and Ka bands and millimeter wave applications.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A flexible metaconductor skin, comprising:
   a flexible substrate;
   at least one layer of non-ferromagnetic metal disposed on the flexible substrate; and
   a layer of ferromagnetic metal disposed on the at least one layer of non-ferromagnetic metal, the layer of ferromagnetic metal consisting of cobalt (Co).

2. The metaconductor skin of claim 1, wherein the at least one layer of non-ferromagnetic metal consists of a single layer of non-ferromagnetic metal.

3. The metaconductor skin of claim 2, wherein the single layer of non-ferromagnetic metal comprises copper (Cu), gold (Au), silver (Ag), aluminum (Al) or graphene.

4. The metaconductor skin of claim 2, comprising a second single layer of the non-ferromagnetic metal disposed on the layer of the ferromagnetic metal, and a second layer of the ferromagnetic metal disposed on the second single layer of the non-ferromagnetic metal.

5. The metaconductor skin of claim 2, comprising a plurality of alternating single layers of the non-ferromagnetic metal and layers of the ferromagnetic metal disposed on the layer of the ferromagnetic metal.

6. The metaconductor skin of claim 5, comprising 10 layers of the non-ferromagnetic metal and 10 layers of the ferromagnetic metal.

7. A flexible metaconductor skin, comprising:
   a flexible substrate;
   at least one layer of non-ferromagnetic metal disposed on the flexible substrate; and
   a layer of ferromagnetic metal disposed on the at least one layer of non-ferromagnetic metal;
   where the metaconductor skin is wrapped around a core in a spiraling fashion with a first end of the metaconductor skin located adjacent to the core and overlapped by the metaconductor skin.

8. The metaconductor skin of claim 7, wherein the layer of ferromagnetic metal consists essentially of cobalt (Co).

9. The metaconductor skin of claim 8, wherein the flexible substrate of the metaconductor skin is adjacent to the core and overlaps the first end of the metaconductor skin.

10. The metaconductor skin of claim 8, wherein the metaconductor skin wraps around the core a plurality of times.

11. The metaconductor skin of claim 10, wherein the core has a non-circular cross-sectional shape.

12. The metaconductor skin of claim 11, wherein the core comprises a planar surface extending along an axial length of the core.

13. The metaconductor skin of claim 8, wherein the core is electrically conductive.

14. The metaconductor skin of claim 8, wherein the core is electrically non-conductive.

15. A flexible metaconductor skin, comprising:
   a flexible substrate, wherein the flexible substrate comprises a ferromagnetic metal layer;
   at least one layer of non-ferromagnetic metal disposed on the flexible substrate; and
   a layer of ferromagnetic metal disposed on the at least one layer of non-ferromagnetic metal.

16. The metaconductor skin of claim 15, wherein the at least one layer of non-ferromagnetic metal consists of a single layer of non-ferromagnetic metal.

17. The metaconductor skin of claim 16, wherein the single layer of non-ferromagnetic metal comprises copper (Cu), gold (Au), silver (Ag), aluminum (Al) or graphene.

18. The metaconductor skin of claim 16, comprising a plurality of alternating single layers of the non-ferromagnetic metal and layers of the ferromagnetic metal disposed on the layer of the ferromagnetic metal.

19. The metaconductor skin of claim 15, wherein the metaconductor skin is wrapped around a core.

20. The metaconductor skin of claim 19, wherein the flexible substrate of the metaconductor skin is adjacent to the core.

* * * * *